United States Patent
Shimizu et al.

(10) Patent No.: US 7,158,398 B2
(45) Date of Patent: Jan. 2, 2007

(54) SEMICONDUCTOR MEMORY DEVICE HAVING ROW DECODER IN WHICH HIGH-VOLTAGE-APPLIED PORTION IS LOCATED ADJACENT TO LOW-VOLTAGE-APPLIED PORTION

(75) Inventors: Akira Shimizu, Yokohama (JP); Riichiro Shirota, Fujisawa (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/052,792

(22) Filed: Feb. 9, 2005

(65) Prior Publication Data

US 2005/0146930 A1    Jul. 7, 2005

Related U.S. Application Data

(62) Division of application No. 10/370,512, filed on Feb. 24, 2003, now Pat. No. 6,868,010.

(30) Foreign Application Priority Data

Nov. 29, 2002  (JP)  ............... 2002-347800

(51) Int. Cl.
G11C 5/06  (2006.01)

(52) U.S. Cl. ............ 365/63; 365/51; 365/185.17; 365/185.23; 365/230.06

(58) Field of Classification Search ............ 365/51, 365/63, 72, 230.06, 185.17, 185.23
See application file for complete search history.

(56) References Cited

U.S. PATENT DOCUMENTS

| 5,530,669 A | 6/1996 | Oyama |
| 5,617,359 A | 4/1997 | Ninomiya |
| 6,278,639 B1 | 8/2001 | Hosono et al. |
| 6,404,274 B1 | 6/2002 | Hosono et al. |
| 6,507,508 B1 * | 1/2003 | Hosono et al. ............... 365/63 |
| 6,853,029 B1 * | 2/2005 | Ichige et al. ............... 257/316 |

FOREIGN PATENT DOCUMENTS

| JP | 2001-176284 | 6/2001 |
| JP | 2002-63795 | 2/2002 |

* cited by examiner

*Primary Examiner*—Hoai V. Ho
(74) *Attorney, Agent, or Firm*—Oblon, Spivak, McClelland, Maier & Neustadt, P.C.

(57) ABSTRACT

A semiconductor memory device includes a first, second, and third memory cell transistors in which information can be electrically rewritten, addresses of which are consecutive in a row direction. One end of a current passage in each of a first, second, and third memory cell transistors is connected to a control electrode of the first, second, and third memory cell transistors. A write voltage, a pass voltage lower than the write voltage, and a first voltage lower than the pass voltage are applied to the other ends of the first, second, and third transfer transistors. A first control section applies the first on-voltage to make the first transfer transistor conductive, to a gate of the first transfer transistor. A second control section applies a second on-voltage to make the second and third transfer transistors conductive, to gates of the second and third transfer transistors.

11 Claims, 16 Drawing Sheets

| Vpgm | 0V | 0V |
|---|---|---|
| 1 | 1+m | |
| 2 | 2+m | |
| 3 | 3+m | |
| 4 | 4+m | |
| ⋮ | ⋮ | ⋮ |
| 1+k | 1+m+k | |
| ⋮ | ⋮ | ⋮ |
| m | 2m | |
| 1+m | 1+2m | 1 |
| 2+m | 2+2m | 2 |
| 3+m | 3+2m | 3 |
| 4+m | 4+2m | 4 |
| 5+m | 5+2m | 5 |
| ⋮ | ⋮ | ⋮ |
| 1+m+2k | 1+2m+2k | 1+2k |
| ⋮ | ⋮ | ⋮ |
| 2m−1 | 3m−1 | m−1 |
| 2m | 3m | m |
| 1+2m | 1+3m | 1+m |
| 2+2m | 2+3m | 2+m |
| 3+2m | 3+3m | 3+m |
| ⋮ | ⋮ | ⋮ |

FIG. 3

| GP1 | GP2 |
|---|---|
| 1 | 1+m |
| 2+m | 2 |
| 3 | 3+m |
| 4+m | 4 |
| 5 | 5+m |
| 6+m | 6 |
| ⋮ | ⋮ |
| ⋮ | ⋮ |
| ⋮ | ⋮ |
| m | 2m |
| 1+2m | 2+2m |
| 3+2m | 4+2m |
| ⋮ | ⋮ |
| ⋮ | ⋮ |
| 3m-2 | 3m-1 |
| 3m |  |
| 1+3m | 2+3m |
| 3+3m | 4+3m |
| ⋮ | ⋮ |
| ⋮ | ⋮ |
| 4m-1 | 4m-2 |
|  | 4m |
| 4m+1 | 4m+2 |
| ⋮ | ⋮ |
| ⋮ | ⋮ |
| km-1 | km-2 |
|  | km |
| 1+km | 2+km |
| 3+km | 4+km |
| ⋮ | ⋮ |
| ⋮ | ⋮ |
| N-2 | N-1 |
| N |  |

FIG. 4A

| GP1 | GP2 |
|---|---|
| 1 | 1+m |
| 2+m | 2 |
| 3 | 3+m |
| 4+m | 4 |
| 5 | 5+m |
| 6+m | 6 |
| ⋮ | ⋮ |
| ⋮ | ⋮ |
| m-1 | 2m-1 |
| 2m | m |
| 1+2m | 2+2m |
| 3+2m | 4+2m |
| ⋮ | ⋮ |
| ⋮ | ⋮ |
| 3m-3 | 3m-2 |
| 3m-1 | 3m |
| 3m+2 | 3m+1 |
| 4+3m | 3+3m |
| ⋮ | ⋮ |
| ⋮ | ⋮ |
| 4m-2 | 4m-3 |
| 4m | 4m-1 |
| 4m+1 | 4m+2 |
| ⋮ | ⋮ |
| ⋮ | ⋮ |
| km-3 | km-2 |
| km-1 | km |
| 2+km | 1+km |
| 4+km | 3+km |
| ⋮ | ⋮ |
| ⋮ | ⋮ |
| N-3 | N-2 |
| N-1 | N |

FIG. 4B

| Vpg | 0V | 0V |
|---|---|---|
| 1 | 6 | |
| 2 | 7 | |
| 3 | 8 | |
| 4 | 9 | |
| 5 | 10 | |
| 6 | 11 | 1 |
| 7 | 12 | 2 |
| 8 | 13 | 3 |
| 9 | 14 | 4 |
| 10 | 15 | 5 |
| 11 | 16 | 6 |
| 12 | 17 | 7 |
| 13 | 18 | 8 |
| 14 | 19 | 9 |
| 15 | 20 | 10 |
| 16 | 21 | 11 |
| 17 | 22 | 12 |
| 18 | 23 | 13 |
| 19 | 24 | 14 |
| 20 | 25 | 15 |
| 21 | 26 | 16 |
| 22 | 27 | 17 |
| 23 | 28 | 18 |
| 24 | 29 | 19 |
| 25 | 30 | 20 |
| 26 | 31 | 21 |
| 27 | 32 | 22 |
| 28 | | 23 |
| 29 | | 24 |
| 30 | | 25 |
| 31 | | 26 |
| 32 | | 27 |

FIG. 5A

| GP1 | GP2 |
|---|---|
| 1 | 6 |
| 7 | 2 |
| 3 | 8 |
| 9 | 4 |
| 5 | 10 |
| 11 | 12 |
| 13 | 14 |
| 15 | |
| 17 | 16 |
| 19 | 18 |
| | 20 |
| 21 | 22 |
| 23 | 24 |
| 25 | |
| 27 | 26 |
| 29 | 28 |
| | 30 |
| 31 | 32 |

FIG. 5B

| Vpg | 0V | 0V |
|---|---|---|
| 1 | 3 | |
| 2 | 4 | |
| 3 | 5 | 1 |
| 4 | 6 | 2 |
| 5 | 7 | 3 |
| 6 | 8 | 4 |
| 7 | 9 | 5 |
| 8 | 10 | 6 |
| 9 | 11 | 7 |
| 10 | 12 | 8 |
| 11 | 13 | 9 |
| 12 | 14 | 10 |
| 13 | 15 | 11 |
| 14 | 16 | 12 |
| 15 | 17 | 13 |
| 16 | 18 | 14 |
| 17 | 19 | 15 |
| 18 | 20 | 16 |
| 19 | 21 | 17 |
| 20 | 22 | 18 |
| 21 | 23 | 19 |
| 22 | 24 | 20 |
| 23 | 25 | 21 |
| 24 | 26 | 22 |
| 25 | 27 | 23 |
| 26 | 28 | 24 |
| 27 | 29 | 25 |
| 28 | 30 | 26 |
| 29 | 31 | 27 |
| 30 | 32 | 28 |
| 31 | | 29 |
| 32 | | 30 |

FIG. 6A

| GP1 | GP2 |
|---|---|
| 1 | 3 |
| 4 | 2 |
| 5 | 6 |
| 8 | 7 |
| 9 | 10 |
| 12 | 11 |
| 13 | 14 |
| 16 | 15 |
| 17 | 18 |
| 20 | 19 |
| 21 | 22 |
| 24 | 23 |
| 25 | 26 |
| 28 | 27 |
| 29 | 30 |
| 32 | 31 |

FIG. 6B

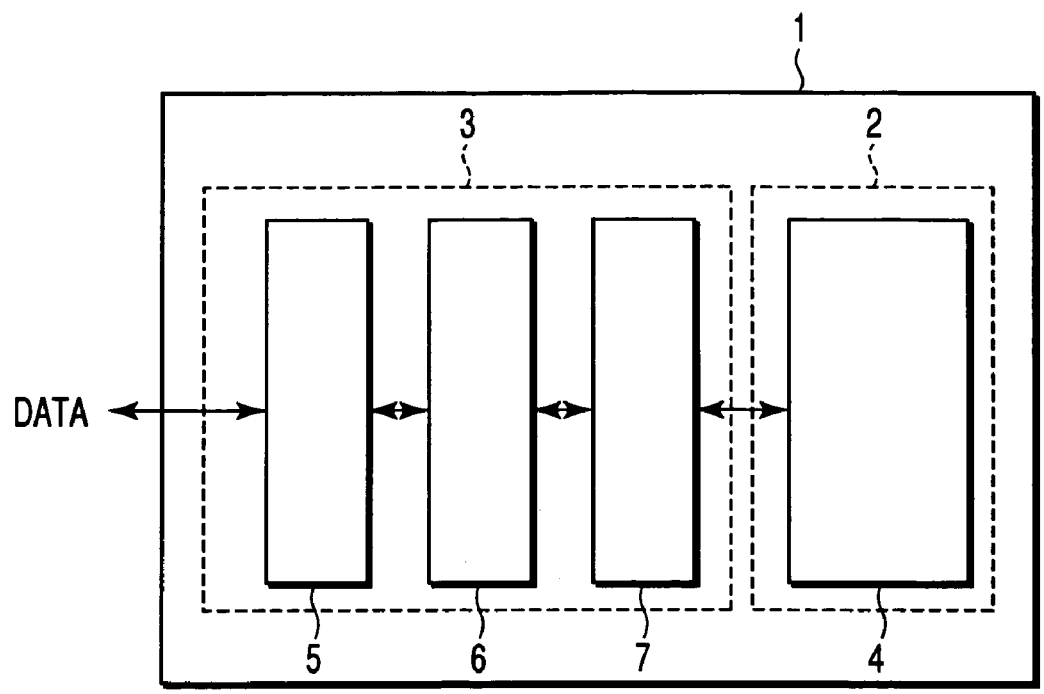
F I G. 16
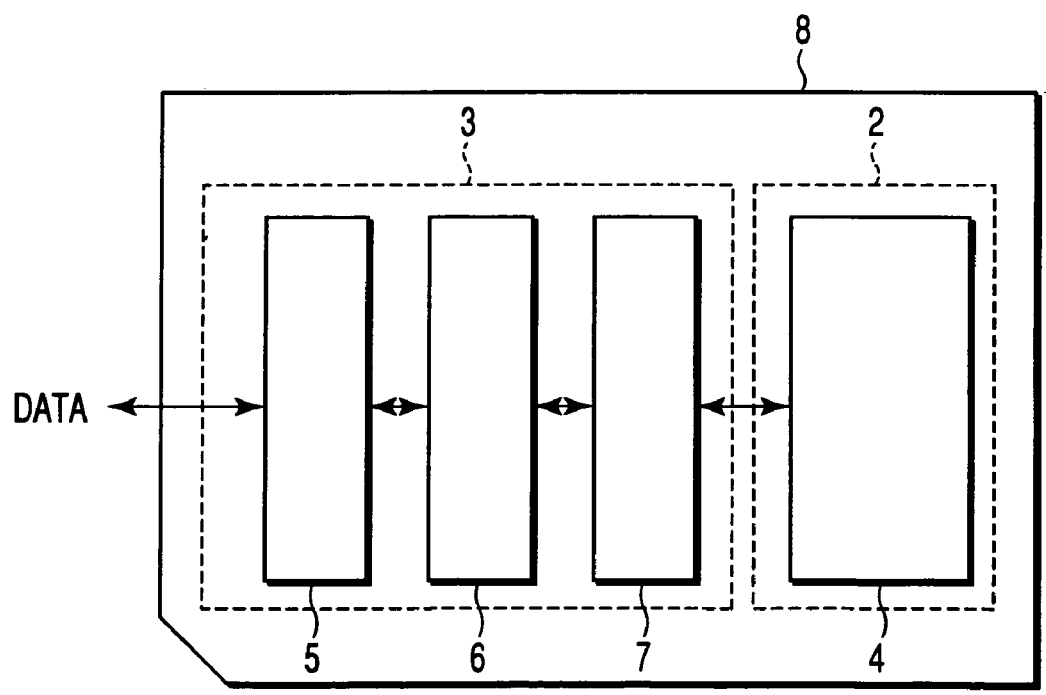
F I G. 17

SEMICONDUCTOR MEMORY DEVICE HAVING ROW DECODER IN WHICH HIGH-VOLTAGE-APPLIED PORTION IS LOCATED ADJACENT TO LOW-VOLTAGE-APPLIED PORTION

CROSS-REFERENCE TO RELATED APPLICATIONS

This application is a Divisional of U.S. application Ser. No. 10/370,512 filed on Feb. 24, 2003 now U.S. Pat No. 6,868,010, and in turn claims the benefit of priority from the prior Japanese Application No. 2002-347800, filed Nov. 29, 2002, the entire contents of both of which are incorporated herein by reference.

BACKGROUND OF THE INVENTION

1. Field of the Invention

The present invention relates to, for example, a semiconductor memory device, and more specifically, to a row decoder in which a high-voltage-applied portion is located adjacent to a low-voltage-applied portion while a write operation is being performed on a NAND type flash memory to which multivalued information can be written.

2. Description of the Related Art

A NAND type flash EEPROM (Electrically Erasable Programmable Read Only Memory) is known as a non-volatile semiconductor memory device. FIG. 18 is a functional block diagram schematically showing a general configuration of a NAND type flash EEPROM (semiconductor memory device). As shown in FIG. 18, this memory is provided with a memory cell array MCA and a row decoder RD. The row decoder RD has a transfer gate section TG and transfer gate control sections TCa and TCb all of which are used to apply voltages to word lines of a memory cell MC.

FIG. 19 schematically shows the memory cell array MCA in FIG. 18. As shown in FIG. 19, a first cell block CB1 of the memory cell array MCA has m NAND columns. Each of the NAND columns has memory transistors MT1 to MT2n connected in series and selection transistors ST1 and ST2. Each of the memory transistors is composed of a known transistor used in a flash memory, or MONOS (Metal Oxide Nitride Oxide Semiconductor) transistor, or the like. For a write, charges are injected into a charge store film (a floating gate electrode). Gates of transistors belonging to the same row in each NAND column are connected together by control gates CGa1 to CGa2n, SGa1, and SGa2. A second cell block CB2 has a similar configuration. One of the selection transistors of each NAND column is connected to bit lines BL1 to BLm. The other is connected to a source line SL.

FIG. 21 schematically shows the transfer gate section TG in FIG. 18. As shown in FIG. 21, transfer gate transistors TRa1 to TRa2n are connected to transfer gate transistors TRb1 to TRb2n, respectively, at their corresponding first ends via connection sections N1 to N2n. Second ends of the transfer gate transistors TRa1 to TRa2n and the transfer gate transistors TRb1 to TRb2n are connected to control gates CGa1 to CGa2n and CGb1 to CGb2n, respectively. a1 to a2n and b1 to b2n correspond to row addresses.

In a semiconductor memory device having this configuration, when information is written to a memory cell MC1 located where the control gate CGa4 crosses the bit line BL2, a low level is first applied to the bit line BL2. On the other hand, a high level is applied to the other bit lines.

With an SB (Self Boost) method, which is commonly used to record binary information, a program voltage Vpg (for example, about 18V) is applied to the control gate CG4a. On the other hand, a pass voltage Vps (for example, about 10V) is applied to the other control gates. As a result, information is written to the memory cell MC1.

To apply the above voltages to the respective control gates, the program voltage Vpg is applied to a connection section N4, while the pass voltage Vps is applied to the other connection sections. Then, an on-voltage Vpgh (=Vpg+a threshold voltage for the transistors) is applied to the gate wire Ga1. As a result, the transfer gate transistors TRa1 to TRa2n are turned on. The voltages at the connection sections N1 to Nn are transferred to the control gates CGa1 to CGan, respectively. At this time, 0V is applied to the gate wire Gb1. Accordingly, the voltages at the connection sections N1 to Nn are not transferred to the control gates CGb1 to CGbn.

When the voltages are applied to the connection sections and word lines, respectively, a parasite transistor is formed between the transfer gate transistors TRa4 and TRa3 (or Tra5) wherein the pass voltage Vps, the program voltage Vpg, and the on-voltage Vpgh are applied to its source, drain, and gate, respectively. However, with such a combination of voltages, a so-called back bias effect is produced to suppress a leak current flowing through the parasite transistor.

Recently, multivalued information is recorded in memory cells. In this case, an LSB (Local Self Boost) method is used to write information. With the LSB method, the program voltage Vpg is applied to the control gate CGa4. Zero V is applied to the control gates CGa3 and CGa5. The pass voltage Vps is applied to the other control gates. When these voltages are applied, a parasite transistor is formed between the transfer gate transistors TRa4 and TRa3 (or Tra5) wherein 0V, the program voltage Vpg, and the on-voltage Vpgh are applied to its source, drain, and gate, respectively. Then, a large leak current flows through this parasite transistor. Thus, to prevent adjacent transfer gate transistors from having such a combination of voltages, the transfer gate section properly determines how to arrange the transfer gate transistors.

Further, an EASB (Erased Area Self Boost) method may be used in place of the LSB method. With the EASB method, 0V is applied to the control gate CGa5, located-adjacent to the control gate CGa4 and closer to a source line. On the other hand, the pass voltage Vps is applied to the other control gates.

As described above, with the LSB method or the EASB method, the transistors can be properly arranged so as to prevent a transfer gate transistor to which 0V is applied from lying adjacent to a transfer gate transistor to which the program voltage Vpg is applied. However, even in this case, it is unavoidable that a transfer gate transistor to which 0V is applied is located adjacent to a transfer gate to which the pass voltage Vps is applied. Thus, a parasite transistor is formed between these transistors wherein 0V, the pass voltage Vps, and the on-voltage Vpgh are applied to its source, drain, and gate, respectively. As a result, the conductivity of an element separating insulating film in this portion is inverted to cause a large leak current to flow.

It is contemplated that the concentration of impurities in an area under an element separating insulating film between transfer gate transistors may be increased in order to suppress a leak current flowing through a parasite transistor (in order to increase an inverse withstanding voltage). However, increasing the concentration of impurities in this area reduces the junction withstanding voltage of the transfer gate transistors.

On the other hand, the leak current can be reduced by using a larger element separating insulating film between the transistors. However, the larger element separating insulating film contributes to increasing the area of the transfer gate section. This hinders a semiconductor memory device based on the LSB or EASB method from having a fine-grained structure.

BRIEF SUMMARY OF THE INVENTION

According an aspect of the present invention, there is provided a semiconductor memory device comprising: a first, a second, and a third memory cell transistors in each of which information can be electrically rewritten, addresses of the first, second, and third memory cell transistors being consecutive in a row direction; a first transfer transistor in which one end of a current passage is connected to a control electrode of the first memory cell transistor and in which a write voltage is applied to the other end; a second transfer transistor in which one end of a current passage is connected to a control electrode of the second memory cell transistor and in which a pass voltage lower than the write voltage is applied to the other end; a third transfer transistor in which one end of a current passage is connected to a control electrode of the third memory cell transistor and in which a first voltage lower than the pass voltage is applied to the other end; a first control section which applies a first on-voltage to make the first transfer transistor conductive, to a gate of the first transfer transistor; and a second control section which applies a second on-voltage to make the second and third transfer transistors conductive, to gates of the second and third transfer transistors, the second on-voltage being different from the first on-voltage.

BRIEF DESCRIPTION OF THE SEVERAL VIEWS OF THE DRAWING

FIG. 3 is a diagram showing transfer gate transistors and applied voltages;

FIGS. 4A and 4B are diagrams showing examples of division of transfer gate transistors;

FIGS. 5A and 5B are diagrams showing specific examples of FIGS. 4A and 4B;

FIGS. 6A and 6B are diagrams showing specific examples of FIGS. 4A and 4B;

FIG. 16 is a diagram schematically showing a semiconductor memory device according to a fifth embodiment of the present invention;

FIG. 17 is a diagram schematically showing a semiconductor memory device according to the fifth embodiment of the present invention;

DETAILED DESCRIPTION OF THE INVENTION

Figure 1:
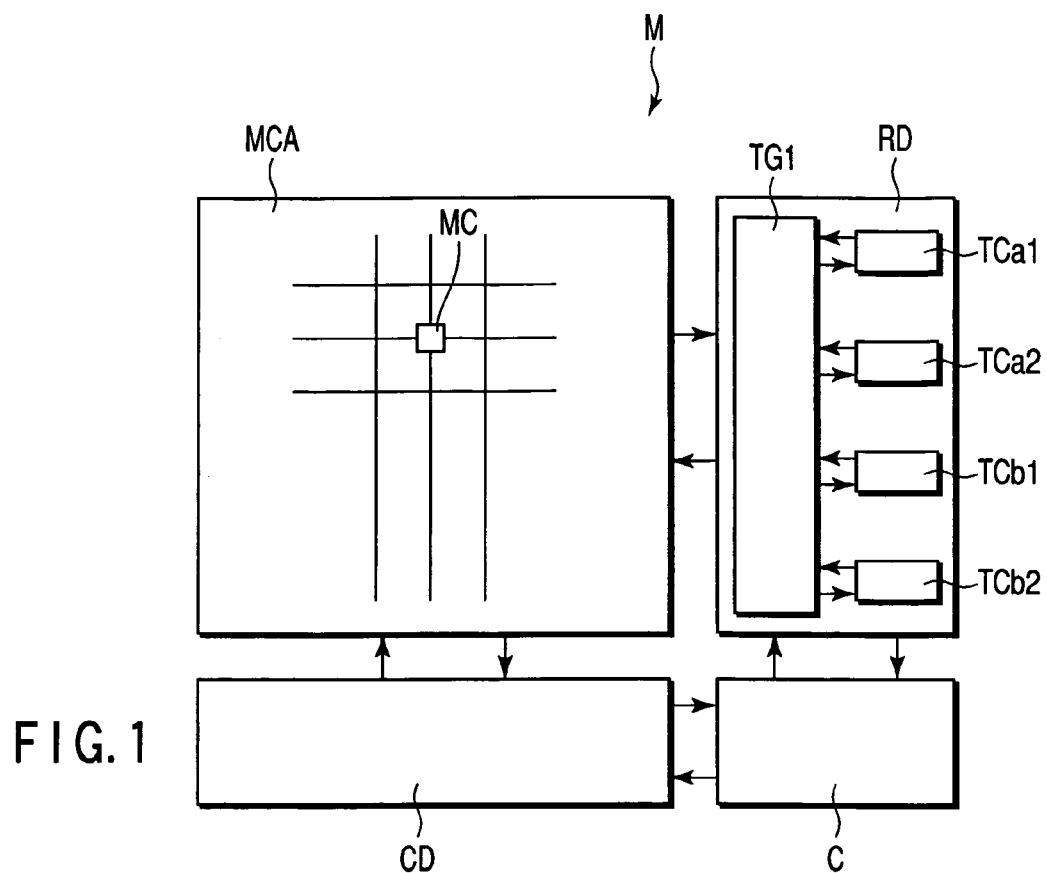
FIG. 1 is a diagram schematically showing a semiconductor memory device according to a first embodiment of the present invention.

Embodiments of the present invention will be described below with reference to the drawings. In the description below, those components which have substantially the same functions and configurations are denoted by the same reference numerals. Duplicate description will be given only when required.

(First Embodiment)

FIG. 1 is a diagram schematically showing a semiconductor memory device according to a first embodiment of the present invention. As shown in FIG. 1, a semiconductor memory device M includes a memory cell array MCA in which memory cells MC are formed. Information is recorded in these memory cells MC. The memory cell array MCA is connected to a row decoder RD and a column decoder CD. The row decoder RD and the column decoder CD are connected to a control section C. The control section C controls the row decoder RD and the column decoder CD according to a supplied address signal. The control section C writes information to a memory cell MC or reads information from a memory cell MC at a predetermined address.

The row decoder RD has a transfer gate section TG1 to apply predetermined voltages to the memory cells MC and transfer gate control sections TCa1, TCa2, TCb1, and TCb2 which control the transfer gate section TG1.

Figure 2:
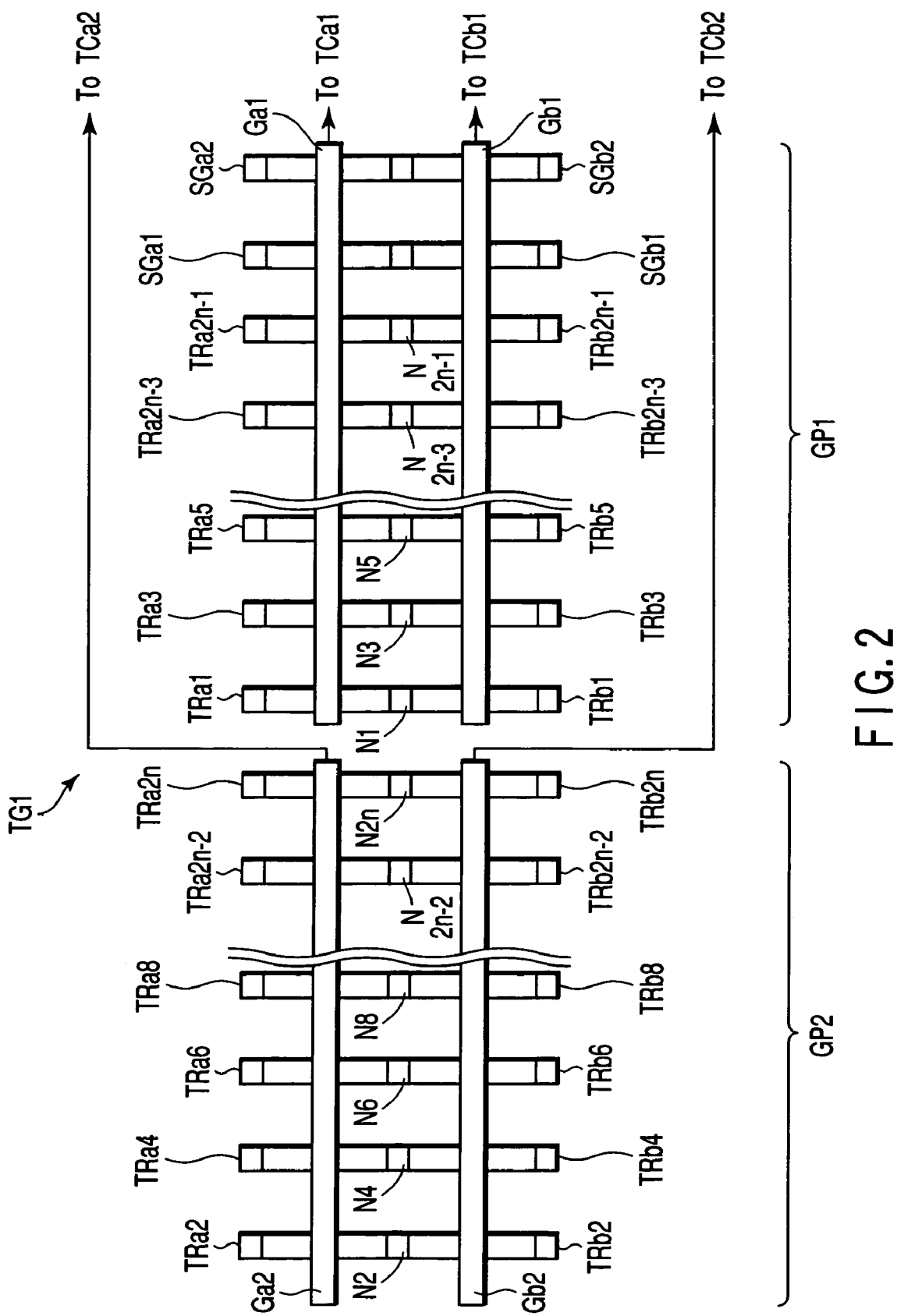
FIG. 2 is a diagram schematically showing a transfer gate section TG1 in FIG. 1.
Figure 19:
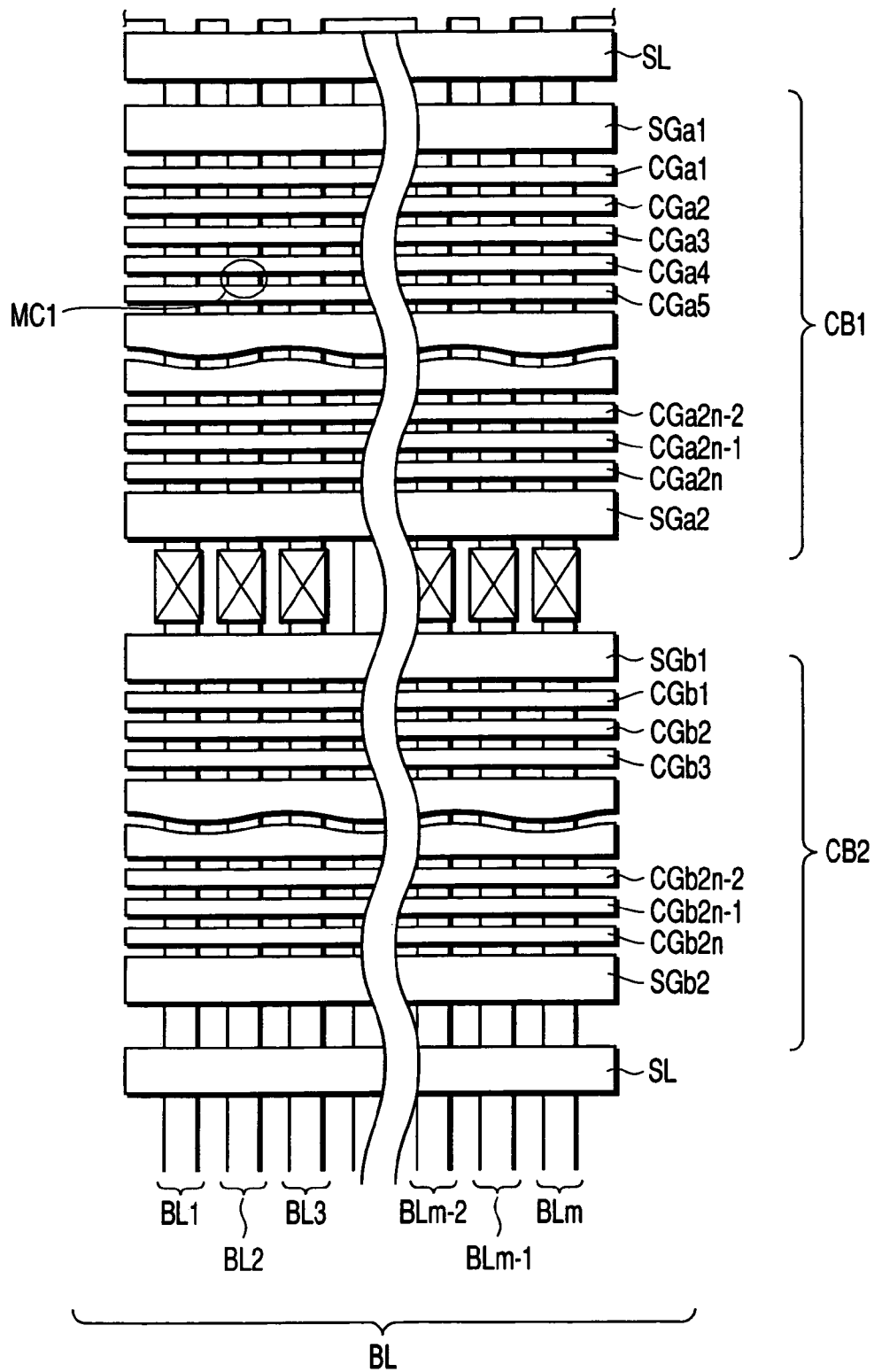
FIG. 19 is a diagram schematically showing a memory cell array MCA in FIG. 18.
Figure 21:
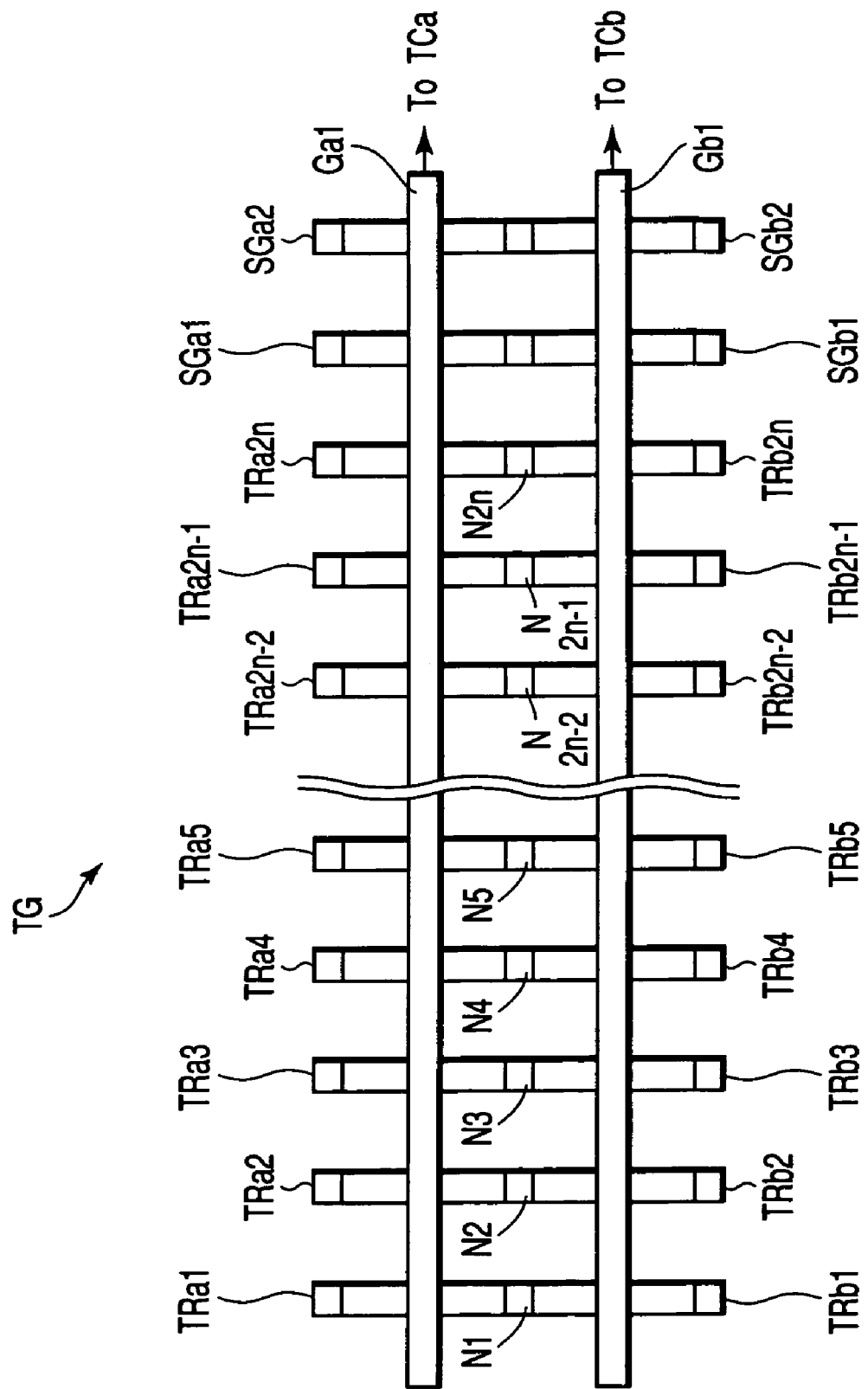
FIG. 21 is a diagram schematically showing a transfer gate TG in FIG. 18.

The structure of the memory cell array MCA is the same as that shown in FIG. 19. FIG. 2 schematically shows the transfer gate section TG1 in FIG. 1. As shown in FIG. 2, the transfer gate section TG1 has a first group GP1 and a second group GP2. The first group GP1 has transfer gate transistors TRa1 and TRb1. First ends (first ends of transistors) of respective current passages of the transfer gate transistors TRa1 and TRb1 are connected together at a connection section N1. A voltage is applied to each connection section N by a contact (not shown). Two transistors having this configuration will hereinafter be referred to as a first "transistor set". The first group GP1 has a third, fifth, ..., 2n-3-th, and 2n-1-th transistor sets.

A second end (second end of a transistor) of current passage of each of the transfer gate transistors TRa1 to TRa2n-1 and TRb1 to TRb2n-1 is connected to a corresponding one of the control gates in FIG. 19. That is, the transistor TRa1 is connected to the control gate CGa1, the transistor TRa3 is connected to the control gate CGa3, ..., and the transistor TRa2n-1 is connected to the control gate CGa2n-1. Similarly, the transistor TRb1 is connected to the control gate CGb1, the transistor TRb3 is connected to the control gate CGb3, ..., and the transistor TRb2n-1 is connected to the control gate CGb2n-1.

A gate of each of the transistors TRa1 to TRa2n-1 is connected to a gate wire Ga1. A gate of each of the transistors TRb1 to TRb2n-1 is connected to a gate wire Gb1. The gate wires Ga1 and Gb1 are connected to the transfer gate control sections TCa1 and TCb1 in FIG. 2.

The second group GP2 has a second, fourth, sixth, eighth, ..., 2n-2-th, and 2n transistor sets. A second end of current passage of each of the transfer gate transistors TRa2 to TRa2n and TRb2 to TRb2n is connected to a corresponding one of the control gates in FIG. 19, as with the first group GP1.

A gate of each of the transistors TRa2 to TRa2n is connected to the gate wire Ga2. A gate of each of the transistors TRb2 to TRb2n is connected to the gate wire Gb2. The gate wires Ga2 and Gb2 are connected to the transfer gate control sections TCa2 and TCb2 in FIG. 1.

Transistors SGa1 and SGb1 are connected together and transistors SGa2 and SGb2 connected together by connecting first ends of their current passages together. Second ends of these transistors are connected to the corresponding selection transistors in FIG. 19. The transistors SGa1, SGa2, SGb1, and SGb2 may be provided in either the first or second group.

Now, operations of a semiconductor memory device having this configuration will be described below taking the LSB method by way of example. First, it is assumed that, for example, information is written to a memory cell MC1 located where a control gate CGa4 crosses a bit line BL2. First, a low level is applied to the bit line BL2. On the other hand, a high level is applied to the other bit lines.

Then, predetermined voltages are provided to the first ends (connection sections) and gates of appropriate transfer gate transistors so that a program voltage Vpg is applied to the control gate CGa4, 0V is applied to the control gates CGa3 and CGa5, and a pass voltage Vps is applied to the other control gates. That is, in the first group, 0V is applied to the transistors TRa3 and TRa5, with the voltage Vps applied to the other transistors. Then, a second on-voltage Vpsh (=Vps+a threshold voltage for the transistors) is applied to the gate wire Ga1, with 0V applied to the gate wire Gb1.

On the other hand, in the second group, the program voltage Vpg is applied to the transistor TRa4, with the voltage Vps applied to the other transistors. Then, a first on-voltage Vpgh is applied to the gate wire Ga2, with 0V applied to the gate wire Gb2. These operations allow information to be written to the memory cell MC1.

Now, description will be given below of the effects of a semiconductor memory device having this configuration. First, a parasite transistor is assumed which is formed by the second group GP2 of the transfer gate section. In a parasite transistor formed by the transistor TRa4 and the adjacent transistor TRa6 or TRa8, the pass voltage Vps, the program voltage Vpg, and the first on-voltage Vpgh are applied to its source, drain, and gate, respectively. This combination is the same as that in the SB method. Consequently, a back bias effect is produced to suppress a leak current.

On the other hand, some of the parasite transistors formed by the first group GP1 have such a combination of voltages that the voltage Vps is applied to their sources with 0V applied to their drains (or 0V is applied to their sources with the voltage Vps applied to their drains). However, the gate voltage required to transfer the pass voltage Vps is the second on-voltage Vpsh as described above. Since the second on-voltage Vpsh is lower than the first on-voltage Vpgh, a required withstanding voltage is lower than that in the case in which the first on-voltage Vpgh is applied to the gate. Thus, it is unnecessary to increase the concentration of impurities in a substrate under an element separating insulating film in this area. Even with the EASB method, this embodiment reduces the number of transfer gate transistors to which 0V is applied, by one compared to the LSB method. Therefore, this embodiment produces similar effects with both methods.

Now, description will be given below of a generalized example of a method of dividing the transfer gate transistors into the first and second groups. FIG. 3 shows the transfer gate transistors and voltages applied to them. The numbers in FIG. 3 each-indicate the ordinal number of a transfer gate transistor TRa, i.e. one of 1 to 2n, relative to the transfer gate transistor TRa1. Further, m indicates the ordinal number of a transfer gate transistor to which 0V is applied, relative to a transfer gate to which the program voltage Vpg is applied. This is because, owing to the characteristics of the memory cells, it may be preferable to apply 0V to a transfer gate separated from a transfer gate to which the program voltage Vpg is applied, by a distance corresponding to a predetermined number of transfer gate transistors. In general, m=1 for the LSB and EASB methods. Further, the pass voltage Vps is applied to the transfer gate transistors other than those denoted by the illustrated numbers.

The first row of this table will be taken by way of example. The first row indicates that if the program voltage Vpg is applied to the transfer gate transistor TRa1, 0V is applied to the transfer gate transistor TRa1+m.

Using FIG. 3, the transfer gates TRa1 to TRan are divided into the first group GP1 and the second group GP2 so as not to form the combination in which the pass voltages Vps and 0V are applied to the connection sections of two adjacent-transfer gate transistors, respectively, with the first on-voltage Vpgh applied to their gates. FIG. 4A illustrates a method of dividing the transfer gate transistors if m is an odd number. FIG. 4B illustrates a method of dividing the transfer gate transistors if m is an even number.

FIG. 5A shows a specific example in which m is an odd number. In this example, each NAND column contains 32 memory cells, i.e. 2n=32 and m=5. FIG. 5B shows an example in which FIG. 5A is used to divide the transfer gate transistors into the first group GP1 and the second group GP2. Likewise, FIGS. 6A and 6B show specific examples in which m is an even number. In this example, 2n=32 and m=2.

According to the first embodiment of the present invention, transfer gate transistors of the row decoder are divided into two groups. Two transfer gate transistors connected to memory cell transistors having consecutive row addresses are divided into two different groups. This makes it possible to avoid applying 0V, the pass voltage Vps, and the first on-voltage Vpgh to the source, drain, and gate, respectively, of a parasite transistor formed by adjacent transfer gate transistors. Consequently, a leak current flowing through the parasite transistor can be reduced without increasing the concentration of impurities in a substrate under an element separating insulating film in an area in which a parasite transistor is formed. This prevents a reduction in the junction withstanding voltage of the transfer gate transistors.

Further, the leak current can be reduced without increasing the distance between transfer gate transistors. Thus, the size of the semiconductor memory device can be reduced even with the LSB and EASB methods.

The order in which the transfer gate transistors are arranged in each of the groups GP1 and GP2 is not limited to the above examples.

(Second Embodiment)

In the first embodiment, the row decoder RD is installed to either the right or left of the memory cell array MCA. In contrast, in the second embodiment, the row decoder RD is installed to both right and left of the memory cell array MCA. Further, the transfer gate transistors are alternately arranged to the right and left of the memory cell array MCA.

Figure 7:
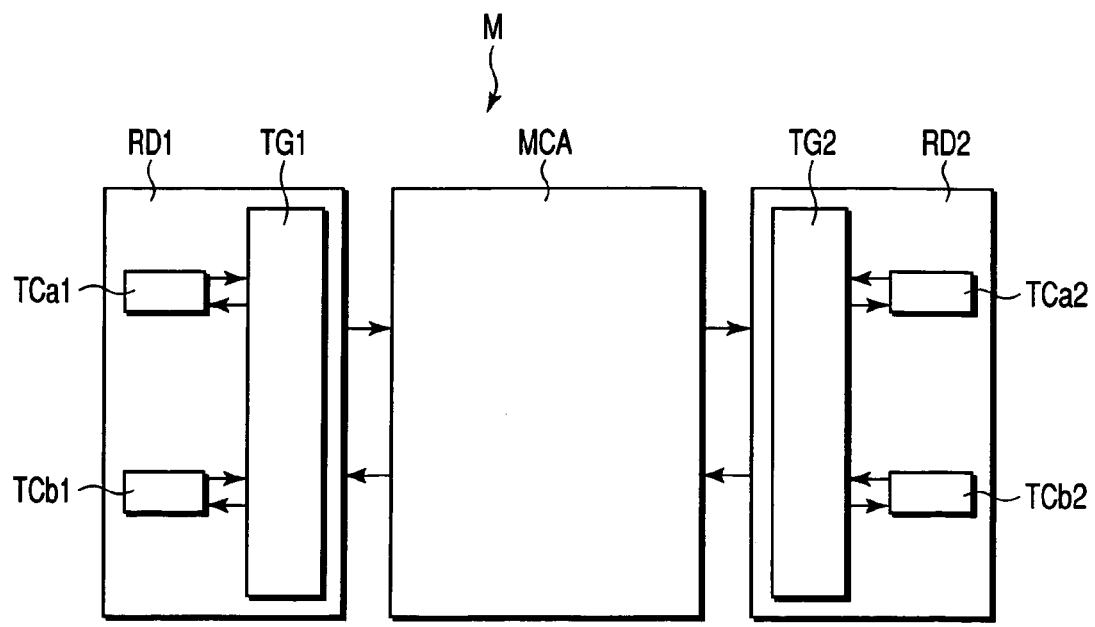
FIG. 7 is a diagram schematically showing a semiconductor memory device according to a second embodiment of the present invention.

FIG. 7 is a block diagram schematically showing a semiconductor memory device according to a second embodiment of the present invention. FIG. 7 illustrates the case in which m is an odd number. As shown in this figure, a row decoder RD1 is installed, for example, to the left of the memory cell array MCA. A row decoder RD2 is installed, for example, to the right of the memory cell array MCA. Of course, the positions of the row decoders RD1 and RD2 are not limited to the configuration shown in FIG. 8. A laterally inverse configuration is possible. The row decoder RD1 has the transfer gate section TG1 and the transfer gate control sections TCa1 and TCb1. The row decoder RD2 has a transfer gate section TG2 and transfer gate control sections TCa2 and TCb2.

Figure 8:
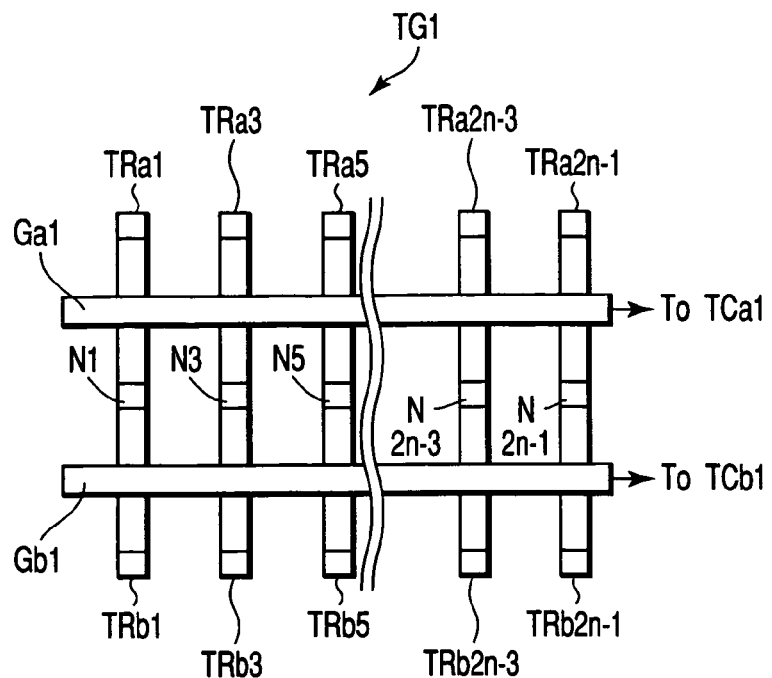
FIG. 8 is a diagram schematically showing a transfer gate section TG1 in FIG. 7.
Figure 9:
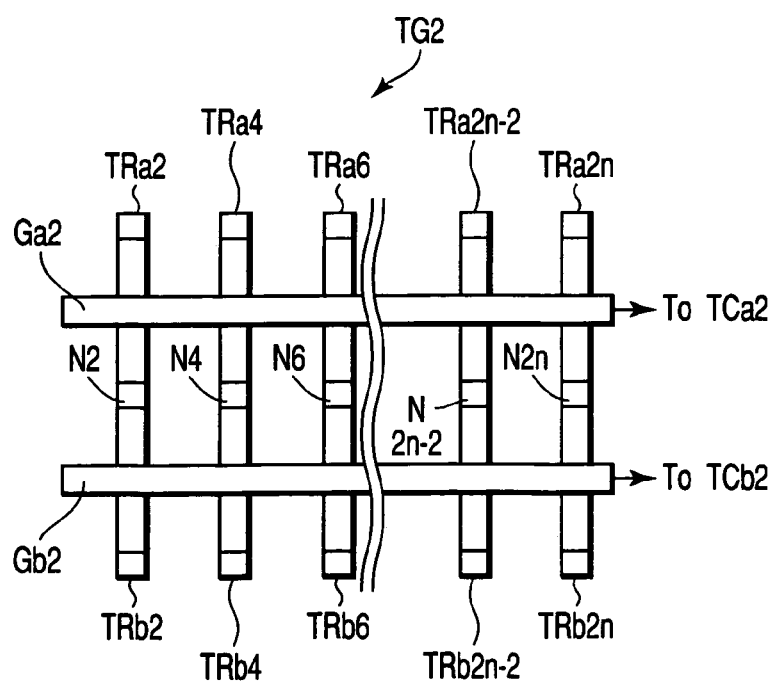
FIG. 9 is a diagram schematically showing a transfer gate section TG2 in FIG. 7.

FIGS. 8 and 9 schematically show the transfer gate sections TG1 and TG2, respectively. As shown in FIG. 8, the transfer gate section TG1 has odd-number-th transistor sets and has the same configuration as the, first group GP1 of transfer gate transistors, shown in FIG. 2. On the other hand, as shown in FIG. 9, the transfer gate section TG2 has even-number-th transfer gate sets and has the same configuration as the second group GP2 of transfer gate transistors, shown in FIG. 2. Operations of a semiconductor memory device having this configuration are similar to those in the first embodiment. Thus, description of these operations is omitted here.

Figure 10:
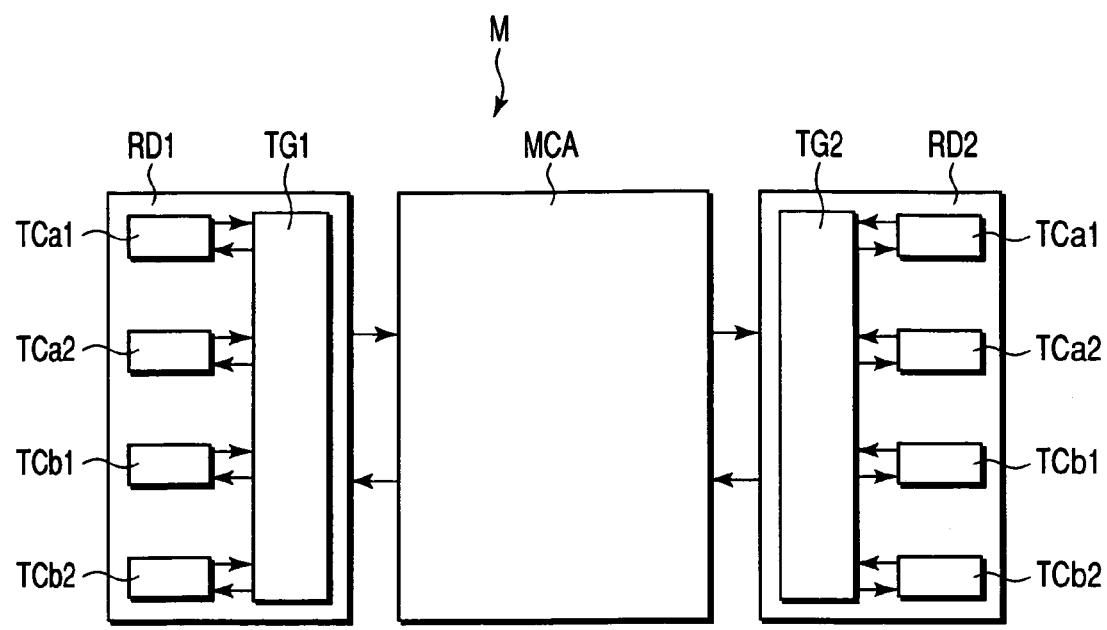
FIG. 10 is a diagram schematically showing a semiconductor memory device according to the second embodiment of the present invention.

Now, the case will be shown in which m is an even number. FIG. 10 is a block diagram schematically showing a semiconductor memory device M according to the second embodiment of the present invention. In FIG. 10, m is an even number. This figure differs from FIG. 7 in that the row decoders RD1 and RD2 each have the transfer gate control sections TCa1, TCa2, TCb1, and TCb2.

Figure 11:
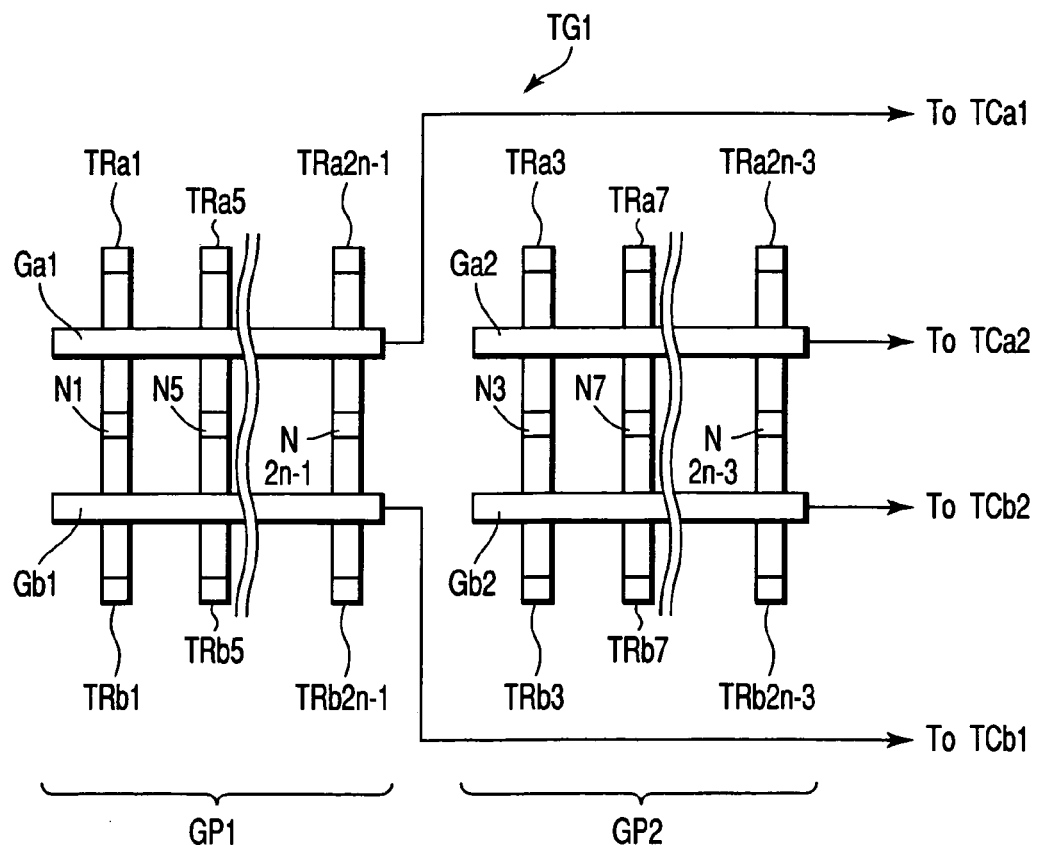
FIG. 11 is a diagram schematically showing a transfer gate section TG1 in FIG. 10.
Figure 12:
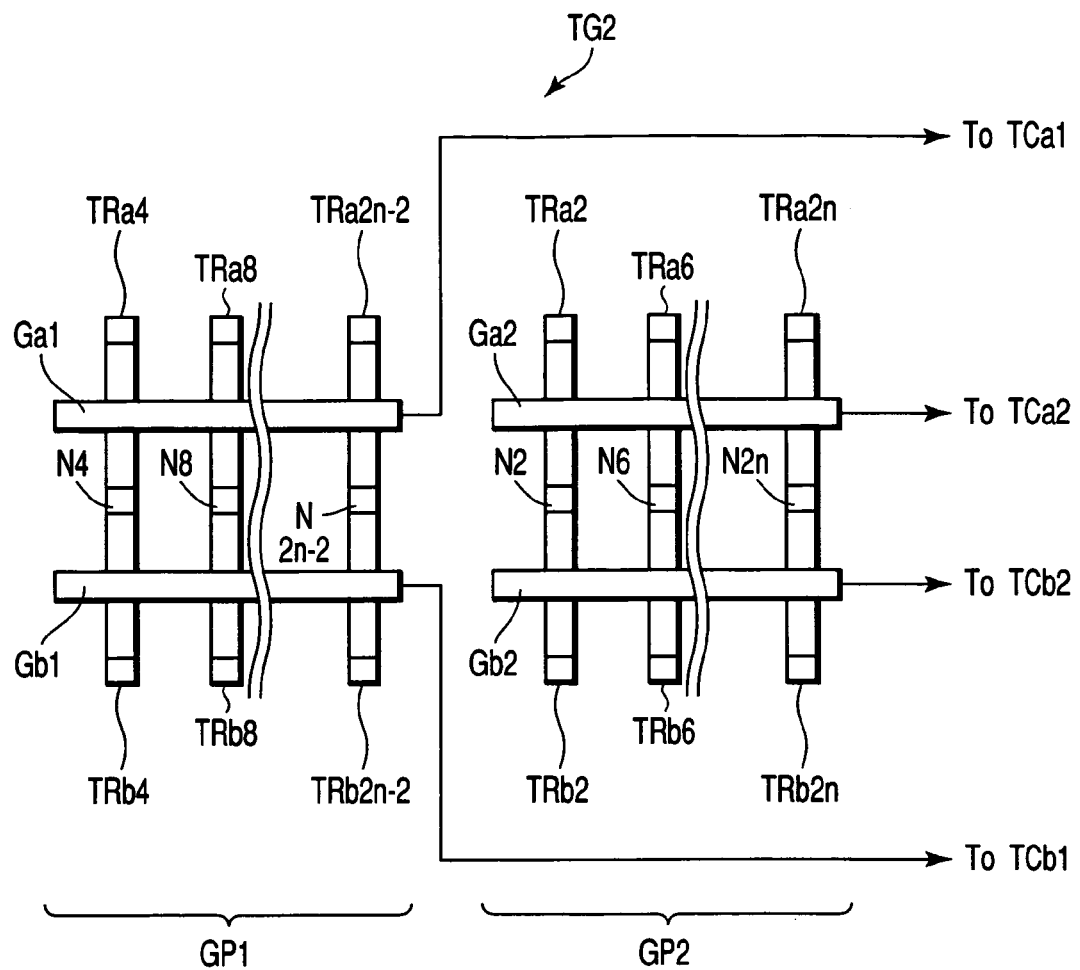
FIG. 12 is a diagram schematically showing a transfer gate section TG2 in FIG. 10.

FIGS. 11 and 12 schematically show the transfer gate sections TG1 and TG2, respectively. As shown in FIGS. 11 and 12, the odd-number-th transistor sets are arranged in the transfer gate section TG1. On the other hand, the even-number-th transistor sets are arranged in the transfer gate section TG2. However, if m is an even number, then the transfer gate sections TG1 and TG2 are each classified into the first group GP1 and the second group GP2 with reference to FIG. 4B so as to avoid forming the combination in which 0V, the pass voltage Vps, and the first on-voltage Vpgh are applied to the source, drain, and gate, respectively, of a parasite transistor.

Specifically, as shown in FIG. 11, the first group GP1 of the transfer gate section TG1 has a first, fifth, . . . , and $2n$-1-th transistor sets. The gates of the transfer gate transistors TRa1, TRa5, . . . , TRa$2n$-1 are connected together by the gate wire Ga1. Further, the gates of the transfer gate transistors TRb1, TRb5, . . . , TRb$2n$-1 are connected together by the gate wire Gb1. The gate wires Ga1 and Gb1 are connected to the transfer gate control sections TCa1 and TCb1, respectively.

On the other hand, the second group GP2 has a third, seventh, . . . , and $2n$-3-th transistor sets. The gates of the transfer gate transistors TRa3, TRa7, . . . , TRa$2n$-3 are connected together by the gate wire Ga2. Further, the gates of the transfer gate transistors TRb3, TRb7, . . . , TRb$2n$-3 are connected together by the gate wire Gb2. The gate wires Ga2 and Gb2 are connected to the transfer gate control sections TCa2 and TCb2, respectively.

Likewise, as shown in FIG. 12, the first group GP1 of the transfer gate section TG2 has a fourth, eighth, . . . , and $2n$-2-th transistor sets. The gates of the transfer gate transistors TRa4, TRa8, . . . , TRa$2n$-2 are connected together by the gate wire Ga1. Further, the gates of the transfer gate transistors TRb4, TRb8, TRb$2n$-2 are connected together by the gate wire Gb1. The gate wires Gb1 and Gb2 are connected to the transfer gate control sections TCa1 and TCb1, respectively.

On the other hand, the second group GP2 has a second, sixth, . . . , and $2n$-th transistor sets. The gates of the transfer gate transistors TRa2, TRa6, . . . , TRa$2n$ are connected together by the gate wire Ga2. Further, the gates of the transfer gate transistors TRb2, TRb6, . . . , TRb$2n$ are connected together by the gate wire Gb2. The gate wires Ga2 and Gb2 are connected to the transfer gate control sections TCa2 and TCb2, respectively.

Operations performed if m is an even number are similar to those performed if m is an odd number. That is, the combination is not formed in which 0V, the pass voltage Vps, and the first on-voltage Vpgh are applied to the source, drain, and gate of a parasite transistor formed by adjacent transfer gate transistors, respectively.

According to the second embodiment of the present invention, in addition to the arrangements of the first embodiment, the row decoders RD1 and RD2 are installed to the left and right, respectively, of the memory cell array MCA. The transistor sets are sequentially sorted between the row decoders RD1 and RD2. The second embodiment produces effects similar to those of the first embodiment.

If m is an even number, the first groups GP1 of the transfer gate transistors TG1 and TG2 may be provided in one row decoder. On the other hand, the second groups GP2 may be provided in the other row decoder. This enables the transfer gate control section to be shared by the odd- and even-number-th transistor sets. Therefore, the number of transfer gate control sections can be reduced.

(Third Embodiment)

Figure 13:
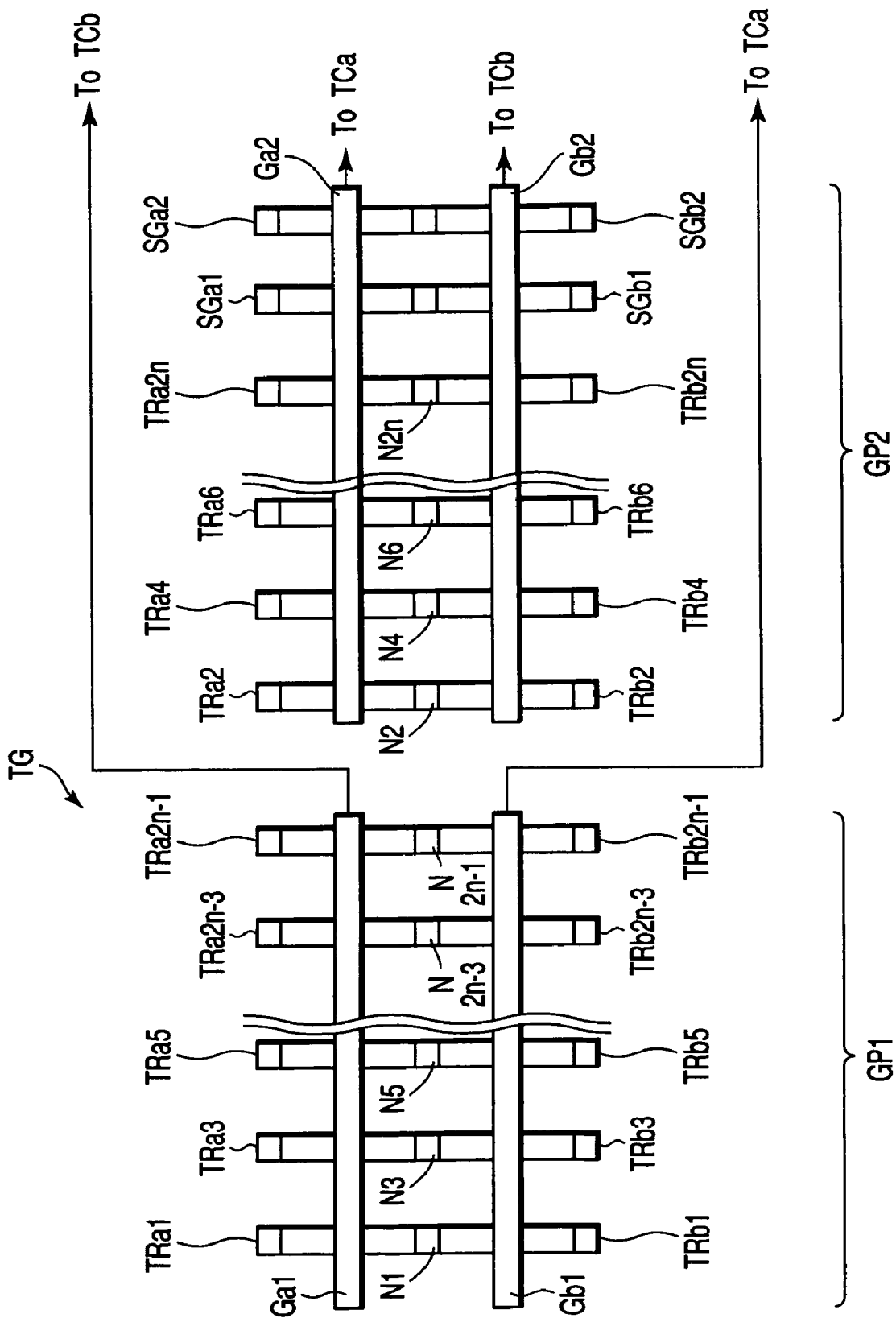
FIG. 13 is a diagram schematically showing a semiconductor memory device according to a third embodiment of the present invention.
Figure 18:
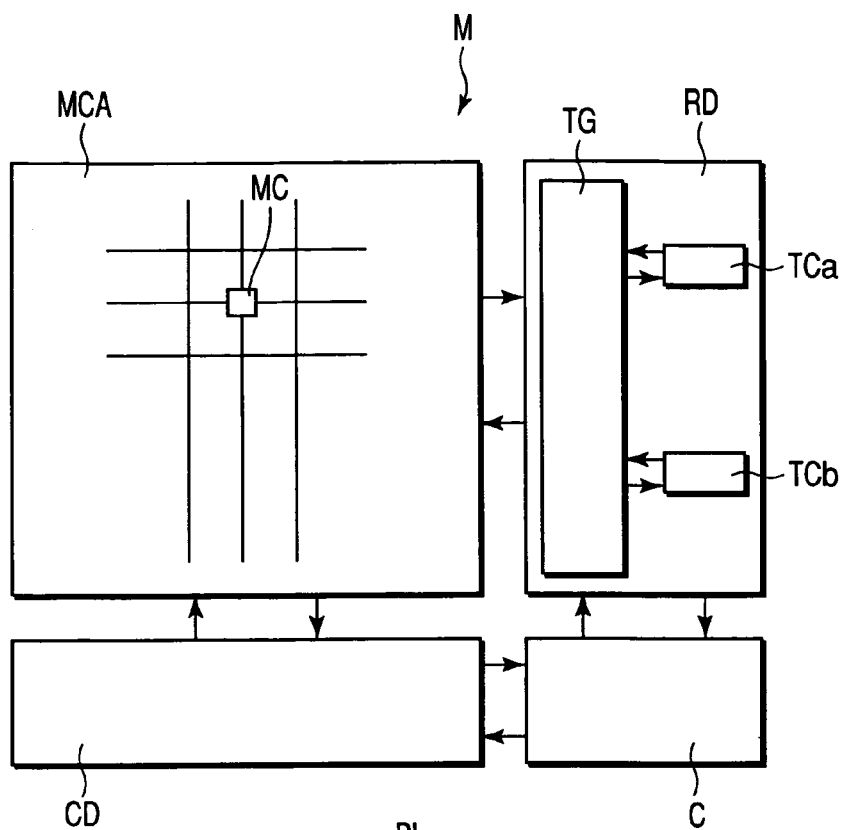
FIG. 18 is a diagram schematically showing the general structure of a semiconductor memory device.
Figure 20:
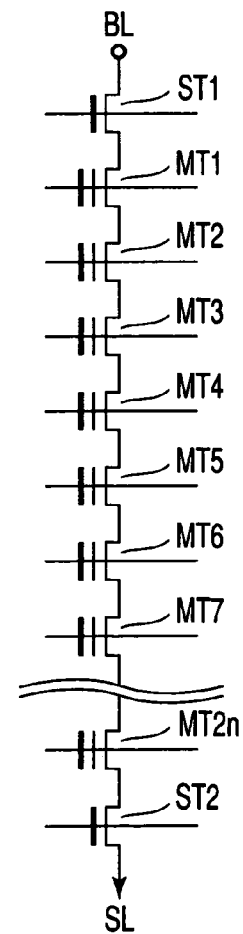
FIG. 20 is a circuit diagram schematically showing a NAND column.

FIG. 13 is a diagram schematically showing a semiconductor memory device according to a third embodiment of the present invention. An entire functional block diagram of this embodiment is similar to FIG. 18. In FIG. 13, the transistor sets are divided into the first group GP1 and the second group GP2. This embodiment differs from the first embodiment in that both gate wires Ga1 and Gb2 are connected to the transfer gate control section TCb and that both gate wires Gb1 and Ga2 are connected to the transfer gate control section TCa.

It is assumed that, with a semiconductor memory device having this configuration, information is written in, for example, the memory MC1, the same position as that in the first embodiment. The following description will be given in conjunction with the LSB method. However, as described in the first embodiment, even with the EASB method, the third embodiment can produce the same effects using substantially the same operations.

First, in the first group GP1, 0V is applied to connection sections N3 and N5, with the pass voltage Vps applied to the other connection sections. On the other hand, the program voltage Vpg is applied to a connection section N4, with the pass voltage Vps applied to the other connection sections. In this state, the transfer gate control section TCa provides the word wires Gb1 and Ga2 with the first on-voltage Vpgh. The transfer gate control section TCb provides the word wires Ga1 and Gb2 with the second on-voltage Vpsh.

In the second group GP2, the first on-voltage Vpgh is applied to the word wire Ga2, which turns on the transfer gate transistor TRa4. Thus, the transfer gate transistor TRa4 transfers the program voltage Vpg. The transfer gate transistors other than TRa4 transfer the voltage Vps. On the other hand, the pass voltage Vpsh is applied to the word wire Gb2. However, this voltage does not cause the transfer gate transistor TRa4 to turn on. Thus, the transfer gate transistor TRa4 does not transfer the program voltage Vpg. That is, operations of the semiconductor memory device are not hindered. Further, the transfer gate transistors other than TRa4 transfer a voltage close to Vpsh. However, this does not cause information to be written incorrectly.

In the group GP1, the pass voltage Vps is applied to the word wire Ga1 and the first on-voltage Vpgh is applied to the word wire Gb1. Accordingly, the voltages at the connection sections N1, N3, . . . , N2n-1 are transferred to the corresponding transistors.

According to the third embodiment, the transfer gate transistors are divided into two groups so as to prevent a transfer gate transistor to which 0V is applied from lying adjacent to a transfer gate transistor to which the pass voltage Vps is applied. Thus, the third embodiment produces effects similar to those of the first embodiment.

Further, the two voltages, i.e. the first on-voltage Vpgh and the second on-voltage Vpsh are applied to the gate wires Ga1 and Gb1 (or Ga2 and Gb2), respectively. This serves to reduce the number of parts of the transfer gate control section compared to the configuration in which the transfer gate transistors are divided into two groups and in which the first on-voltage Vpgh, the second on-voltage Vpsh, and 0V are applied to the gate wires.

(Fourth Embodiment)

A fourth embodiment is applied if only the LSB method or both EASB and SB (Self Boost) methods are applied to the memory cells. The LSB method will be taken by way of example below. In the description below, however, simple references to the "LSB method" also refer to the EASB method.

With the SB method, the pass voltage Vps, the program voltage Vpg, and the first on-voltage Vpgh are applied to the source, drain, and gate of a parasite transistor formed by adjacent transfer gate transistors, respectively. With such a combination, the aforementioned back bias effect is produced to suppress a leak current. Thus, in the fourth embodiment, only the element separating insulating film between transfer gate transistors connected to LSB-based memory cells is formed to be larger than that in the SB method.

Figure 14:
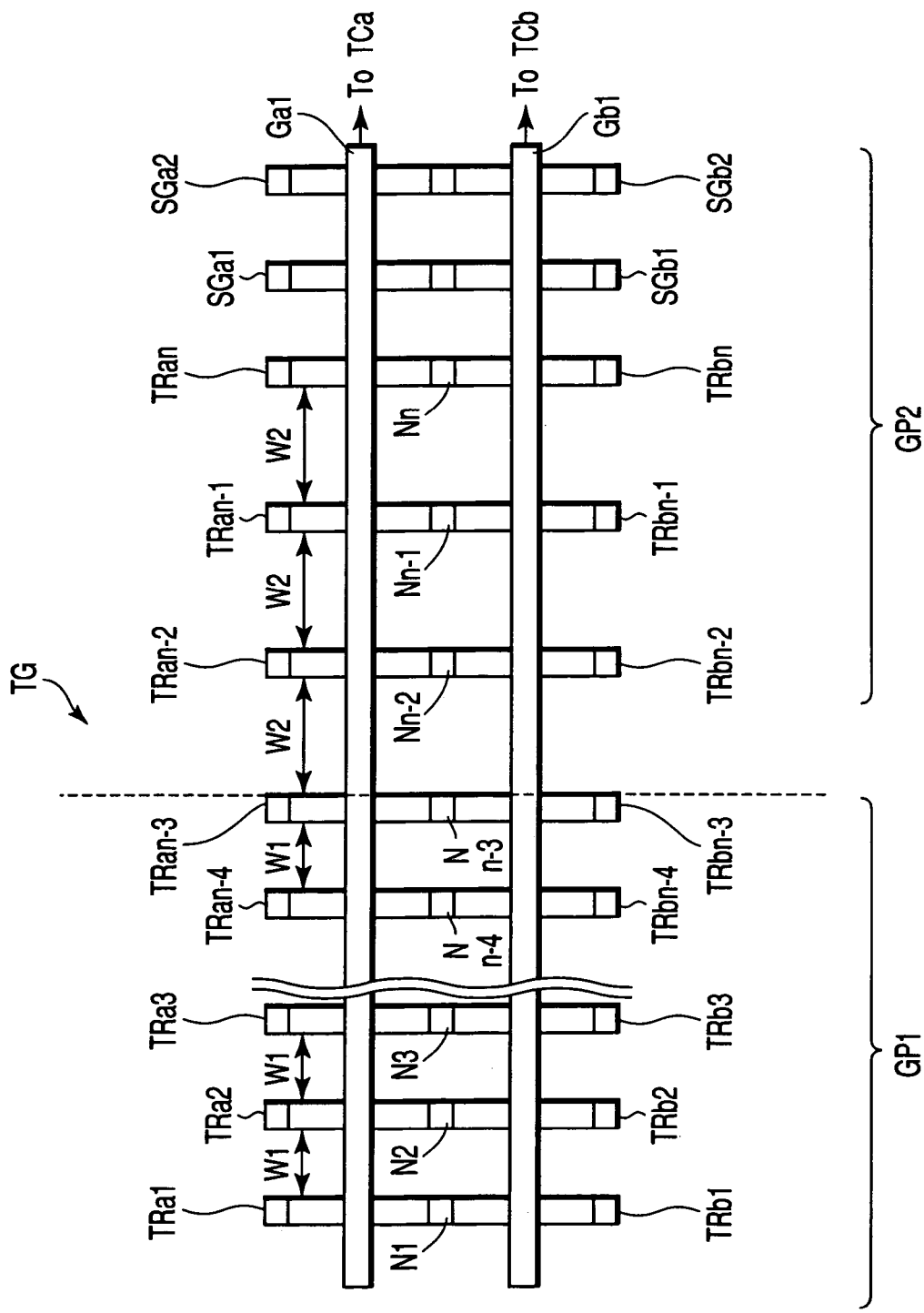
FIG. 14 is a diagram schematically showing a semiconductor memory device according to a fourth embodiment of the present invention.

FIG. 14 schematically shows a semiconductor memory device according to the fourth embodiment of the present invention. An entire functional block diagram of this embodiment is similar to FIG. 18. As shown in FIG. 14, the first group GP1 has, for example, a first to n-3-th transistor sets. The distance between the adjacent transistor sets is W1 as in the case with the SB method. The width W1 is set so as to sufficiently suppress a leak current flowing through a parasite transistor in which the pass voltage Vps, the program voltage Vpg, and the first on-voltage Vpgh are applied to its source, drain, and gate, respectively.

The second group GP2 has, for example, a n-2-th, n-1-th, . . . , n-th transistor sets. The distance between the adjacent transistor sets is W2, which is larger than W1. The width W2 is set so as to sufficiently suppress a leak current flowing through a parasite transistor in which 0V, the pass voltage Vps, and the first on-voltage Vpgh are applied to its source, drain, and gate, respectively.

In a semiconductor memory device having this configuration, the first group GP1 of transfer gate transistors are connected to the gates of SB-based memory cell transistors. On the other hand, the second group GP2 of transfer gate transistors are connected to the gates of LSB-based memory cell transistors. In FIG. 14, the n-3-th transistor set constitutes the boundary between the first and second groups GP1 and GP2. However, the present invention is not limited to this aspect.

Figure 15:
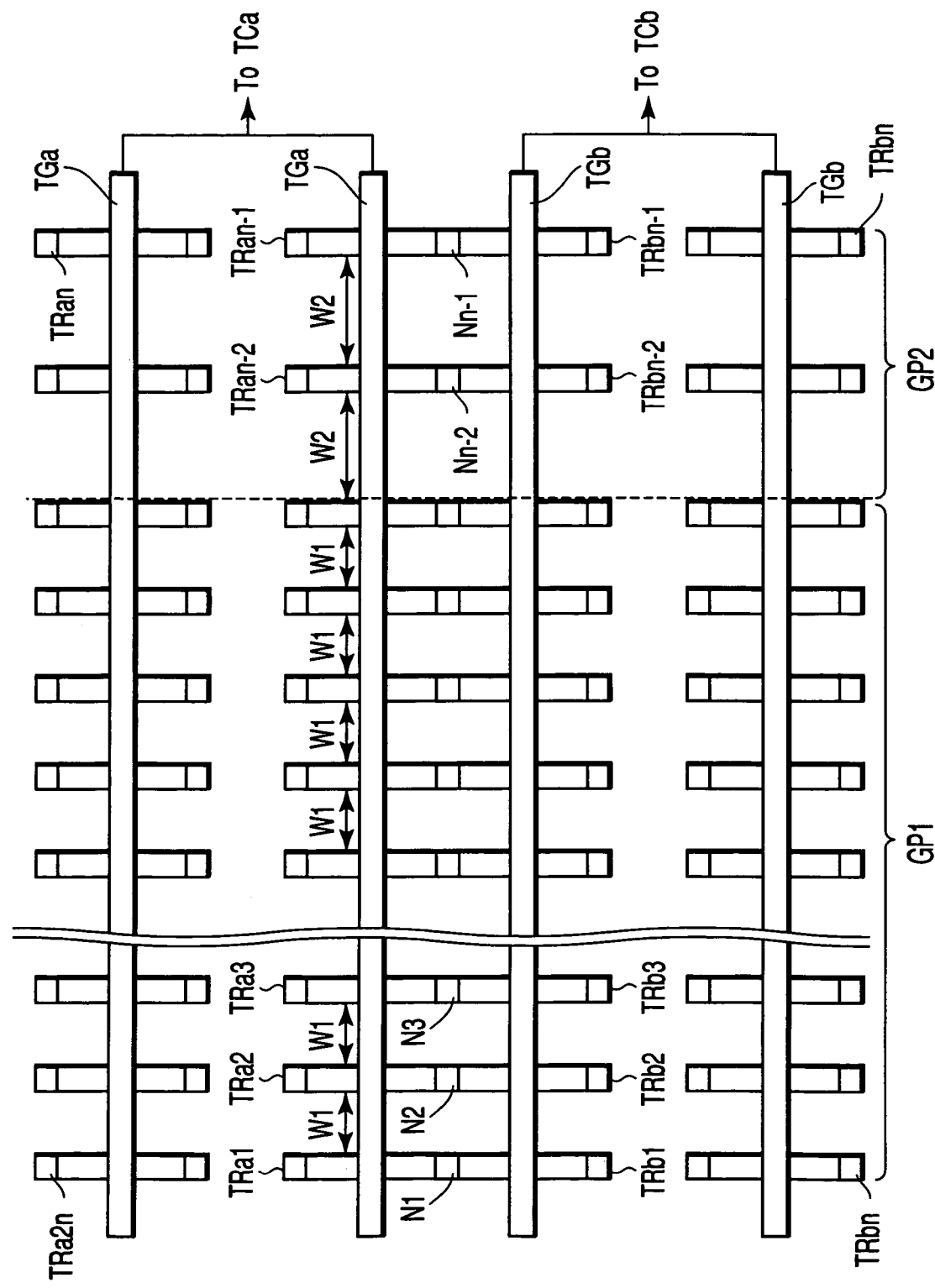
FIG. 15 is a diagram schematically showing a semiconductor memory device according to a variation of the fourth embodiment.

FIG. 15 schematically shows a semiconductor memory device according to a variation of the fourth embodiment. As shown in FIG. 15, the transfer gate transistors TRa1 to TRa2n are divided into, for example, a row having the transfer gate transistors TRa1 to TRan-1 and a row having the transfer gate transistors TRan to TRa2n. Similarly, the transfer gate transistors TRb1 to TRb2n are divided into, for example, a row having the transfer gate transistors TRb1 to TRbn-1 and a row having the transfer gate transistors TRbn to TRb2n. Then, the transistors TRa1 to TRan-1 are connected to the transistors TRb1 to TRbn-1, respectively.

The transfer gate transistors TRa1 to TRan-1 are provided at positions corresponding to the transfer gate transistors TRa2n to TRan in the vertical direction. This also applies to the transfer gate transistors TRb1 to TRb2n.

In this manner, the four vertical transistor rows are divided into the first group GP1 and the second group GP2 at an appropriate position. In FIG. 15, the boundary is formed, for example, at the position of the transfer gate transistors TRan-2 and TRbn-2. Alternatively, of course, it is possible to provide five or more vertical rows.

According to the fourth embodiment of the present invention, the plurality of transfer gate transistors are divided into the first group GP1 and the second group GP2. The distance between the adjacent transfer gate transistors differs between the first group GP1 and the second group GP2. Thus, the adjacent transfer gate transistors in one of the groups is separated by a small distance, whereas the adjacent transfer gate transistors in the other group is separated by a large distance. The transfer gate transistors of one group are connected to the memory transistors based on a write method different from that for the memory transistors connected to the transfer gate transistors of the other group. This makes it possible to minimize the area in which the adjacent transfer gate transistors must be separated by a large distance. Thus, whether the LSB or EASB method is used, a semiconductor memory device can be realized which provides a sufficient withstanding voltage while allowing the minimization of the rate of an increase in area.

(Fifth Embodiment)

In recent years, a non-volatile semiconductor memory device has been used in a main memory section of an IC card such as a memory card. A typical memory card includes the main memory section and a control section that controls the main memory section. A fifth embodiment is an example in which the present invention is applied to such an IC card.

FIGS. 16 and 17 are functional block diagrams schematically showing a semiconductor memory device according to the fifth embodiment of the present invention. As shown in FIG. 16, an IC chip 1 has a memory section 2 as a main memory section and a control section 3 that mediates in transmission of information between the IC chip 1 and equipment outside the IC chip. The semiconductor memory device M according to the first to fourth embodiments is used as a memory 4 functioning as the memory section 2. In this figure, description will be given of those of a number of circuit blocks included in the control section 3 which specifically relate to the main memory section.

As circuit blocks relating to the main memory section, the IC chip has, for example, a serial/parallel parallel/serial interface 5, a page buffer 6, and a memory interface.

For a data write to the memory 4, the serial/parallel parallel/serial interface 5 converts, for example, serial input data DATA into parallel internal data. The internal data obtained is input to the page buffer 6, where it is stored. The stored internal data is written to the memory 4 via the memory interface.

Further, for a data read from the IC chip 1, data read from the memory 4 is input to the page buffer 6 via the memory interface 7. The data is then stored in the page buffer 6. The stored internal data is input to the serial/parallel parallel/serial interface 5, where it is converted into serial output data. The output data DATA obtained is output to the exterior of the chip.

This IC chip 1 is formed so as to be integrated with a card type package 8 as shown in FIG. 17 to function as, for example, an IC card such as a memory card. Specifically, the IC chip 1 is accommodated or mounted in or stuck to the card type package 8 for integration.

According to the fifth embodiment of the present invention, the semiconductor memory device M according to the first to fourth embodiments is used as the memory 4, for example, in the IC chip 1, a single chip formed of the control section and the memory. Consequently, the fifth embodiment produces effects similar to those shown in the first to fourth embodiments, in IC chips, IC cards, and the like, which are commonly used now.

Further, in the first to fifth embodiments, description has been given of the semiconductor memory device to which multivalued information can be written. However, these embodiments are also applicable to a semiconductor memory device to which binary information can be written. Similar effects are also produced in this case.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having transfer transistors to apply a voltage to a control electrode of electrically rewritable memory cell transistors, the semiconductor memory device comprising:
    a first transfer transistor in which one end of a current passage is connected to the control electrode of one of the memory cell transistors and is spaced from an adjacent transfer transistor having one end of a current passage connected to the control electrode of one of the memory cell transistors by a first width;
    a second transfer transistor in which one end of a current passage is connected to the control electrode of one of the memory cell transistors and is spaced from an adjacent transfer transistor having one end of a current passage connected to the control electrode of one of the memory cell transistors by a second width, the second width being different from the first width; and
    a first control section which applies an on-voltage to make the first and second transfer transistors conductive, to gates of the first and second transfer transistors.

2. The device according to claim 1, wherein the second width is larger than the first width.

3. The device according to claim 1, wherein the memory cell transistor connected to the first transfer transistor supports a first write method of writing information to this memory cell transistor using substantially two voltages different from each other, and the memory cell transistor connected to the second transfer transistor supports a second write method of writing information to this memory cell transistor using substantially three voltages different from each other.

4. The device according to claim 3, wherein the first write method is a self boost method, and the second write method is selected from a group consisting of a local self boost method and an erased area self boost method.

5. An IC card comprising:
    a support member;
    a semiconductor memory device formed on the support member; and
    a control device electrically connected to the semiconductor memory device,
    wherein the semiconductor memory device comprises:
    a first transfer transistor in which one end of a current passage is connected to the control electrode of one of electrically rewritable memory cell transistors and is spaced from an adjacent transfer transistor having one end of a current passage connected to the control electrode of one of the memory cell transistors by a first width;
    a second transfer transistor in which one end of a current passage is connected to the control electrode of one of the cell transistors and is spaced from an adjacent transfer transistor having one end of a current passage connected to the control electrode of one of the memory cell transistors by a second width, the second width being different from the first width; and
    a first control section which applies an on-voltage to make the first and second transfer transistors conductive, to gates of the first and second transfer transistors.

6. The IC card according to claim 5, wherein the control device comprises a page buffer storable data which is read out from the memory device.

7. A semiconductor memory device having transfer transistors to apply a voltage to a control electrode of electrically rewritable memory cell transistors, the semiconductor memory device comprising:
    a first transfer transistor in which one end of a current passage is connected to the control electrode of one of the memory cell transistors; and
    a second transfer transistor in which one end of a current passage is connected to the control electrode of one of the cell transistors,
    wherein the memory cell transistor connected to the first transfer transistor supports a first write method of writing the memory cell transistor using substantially two voltages different from each other, and the memory cell transistor connected to the second transfer transistor supports a second write method of writing the memory cell transistor using substantially three voltages different from each other.

8. The device according to claim 7, wherein the first transfer transistor is spaced from an adjacent transfer transistor having one end of a current passage connected to the control electrode of one of the memory cell transistors by a first width and the second transfer transistor is spaced from an adjacent transfer transistor having one end of a current passage connected to the control electrode of one of the memory cell transistors by a second width different from the first width.

9. The device according to claim 7, wherein the first write method is a self boost method, and the second write method is selected from a group consisting of a local self boost method and an erased area self boost method.

10. An IC card comprising:
a support member;
a semiconductor memory device formed on the support member; and
a control device electrically connected to the semiconductor memory device,
wherein the semiconductor memory device comprises: a first transfer transistor in which one end of a current passage is connected to the control electrode of one of electrically rewritable memory cell transistors; and a second transfer transistor in which one end of a current passage is connected to the control electrode of one of the memory cell transistors, and
the memory cell transistor connected to the first transfer transistor supports a first write method of writing the memory cell transistor using substantially two voltages different from each other, and the memory cell transistor connected to the second transfer transistor supports a second write method of writing the memory cell transistor using substantially three voltages different from each other.

11. The IC card according to claim 10, wherein the control device comprises a page buffer storable data which is read out from the memory device.

* * * * *